United States Patent
Kwon et al.

(10) Patent No.: US 7,564,086 B2
(45) Date of Patent: Jul. 21, 2009

(54) SELF-ALIGNED, SILICIDED, TRENCH-BASED DRAM/EDRAM PROCESSES WITH IMPROVED RETENTION

(75) Inventors: Oh-Jung Kwon, Hopewell Junction, NY (US); Kim Bosang, Mount Vernon, NY (US); Herbert Lei Ho, New Windsor, NY (US); Ali Babar Khan, Ossining, NY (US); Deok-kee Kim, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 143 days.

(21) Appl. No.: 11/566,360

(22) Filed: Dec. 4, 2006

(65) Prior Publication Data

US 2007/0235792 A1    Oct. 11, 2007

Related U.S. Application Data

(62) Division of application No. 10/905,684, filed on Jan. 17, 2005, now Pat. No. 7,153,737.

(51) Int. Cl.
 *H01L 29/76* (2006.01)
(52) U.S. Cl. ............... 257/301; 438/243; 257/E27.092; 365/149

(58) Field of Classification Search .................. 257/71, 257/E21.646, E27.084, E27.091–E27.093, 257/E29.346, 296, 301–305, E27.085; 438/212, 438/241, 243, 387; 365/149
See application file for complete search history.

(56) References Cited

U.S. PATENT DOCUMENTS

| | | | |
|---|---|---|---|
| 6,410,399 | B1 | 6/2002 | Flaitz et al. |
| 6,440,794 | B1 | 8/2002 | Kim |
| 6,452,224 | B1 | 9/2002 | Mandelman et al. |
| 6,759,702 | B2 | 7/2004 | Radens et al. |
| 6,815,749 | B1 | 11/2004 | Mandelman et al. |
| 6,909,137 | B2 | 6/2005 | Divakaruni et al. |
| 2004/0180492 | A1 * | 9/2004 | Mandelman et al. ....... 438/200 |

* cited by examiner

*Primary Examiner*—Steven Loke
*Assistant Examiner*—Suberr Chi
(74) *Attorney, Agent, or Firm*—Howard M. Cohn (57) ABSTRACT

A DRAM cell in a substrate has a deep trench (DT) extending from a surface of the substrate into the substrate, a word line (WL) formed on the surface of the substrate adjacent the deep trench, and oxide (TTO) disposed in a top portion of the trench and extending beyond the trench in the direction of the word line. In this manner, when silicided, there is oxide rather than silicon on the surface of the substrate in a gap between the word line (WL) and a passing word line (PWL) disposed above the deep trench.

5 Claims, 5 Drawing Sheets

DRAM CELL

SELF-ALIGNED, SILICIDED, TRENCH-BASED DRAM/EDRAM PROCESSES WITH IMPROVED RETENTION

CROSS REFERENCE TO RELATED APPLICATIONS

This application is a division of commonly-owned, U.S. patent application Ser. No. 10/905,684 entitled SELF-ALIGNED, SILICIDED, TRENCH-BASED, DRAM/EDRAM PROCESSES WITH IMPROVED RETENTION, and filed on Jan. 17, 2005.

BACKGROUND OF THE INVENTION

The invention relates to semiconductor device fabrication and, more particularly, to techniques involving siliciding (or, silicidizing) silicon-containing areas in the array region of a dynamic random access memory (DRAM) or embedded DRAM (eDRAM) device to lower electrical resistance and to improve device reliability.

Silicides are alloys of silicon (Si) and metal and are used as contact material in silicon device manufacturing. The various metals which are alloyed with silicon include cobalt (Co, resulting in $CoSi_2$), titanium (Ti, resulting in $TiSi_2$), platinum (Pt, resulting in PtSi), molybdenum (Mo, resulting in $MoSi_2$), tungsten (W, resulting in $WSi_2$), tantalum (Ta, resulting in $TaSi_2$), Nickel (Ni, resulting in NiSi), and Nickel Platinum (NiPt, resulting in NiPtSi).

The one-device DRAM cell consists of a cell transistor with the drain (or source) connected to one node of the cell storage capacitor, the source (or drain) connected to a bit line, and the gate connected to the word line, which runs orthogonal to the bit line. The requirement to have a large capacitor in a small space with low leakage is the main driver of DRAM technology. A brief description of the cell operation will help to explain why. To write, the bit line is driven to a high or low logic level with the cell transistor turned on, and then the cell transistor is shut off, leaving the capacitor charged high or low. Since charge leaks off the capacitor, a maximum refresh interval is specified. To read, or refresh the data in the cell, the bit line is left floating when the cell transistor is turned on, and the small change in bit-line potential is sensed and amplified to a full logic level. The ratio of cell capacitance to bit-line capacitance, called the transfer ratio, which ranges from about 0.1 to 0.2, determines the magnitude of the change in bit-line potential. A large cell capacitance is needed to deliver an adequate signal to the sense amplifier. As further noted in this article, in a folded bit-line configuration, a cell is crossed by two word lines and one bit line. One of the word lines (WL1) is the "active word line" (or simply "word line") for the cell, and forms the gate of the cell device. The second word line (WL2), the "passing word line," is the gate of the cell device on the adjacent cell.

U.S. Pat. No. 6,410,399 (referred to as "the '399 patent") discloses a process to lower strap, wordline and bitline contact resistance in trench-based DRAMS by silicidization. As disclosed therein, insofar as eDRAMs are concerned, the buried strap is a conductive pathway in an eDRAM device located between the active silicon on the drain side of the field effect transistor (FET) and the trench capacitor. The buried strap facilitates charges to be written to, or read from, the capacitor and comprises a highly doped portion of the substrate. Physically, the buried strap is approximately 100 nm thick, extends across the pathway, and is buried approximately 50 nm below the surface of the substrate.

As noted in the '399 patent, in the art, it is known to use various approaches to reduce resistance and improve reliability at lower temperatures. For example, designers have implemented shorter pathways in conjunction with utilizing highly conductive metals, and/or highly doped areas of the substrate, and/or highly conducting silicides, notably, the silicides of cobalt, nickel and titanium.

As noted in the '399 patent, in this regard, silicides are conventionally formed in self-aligned processes, whereby a metal film is deposited over the silicon-containing region to be silicidized (silicided). The process involves in-situ cleaning of the silicon-containing region, followed by deposition of a metal on the silicon-containing region by means well known in the art. Thereafter, the structure is annealed by heating to form the silicide. Any unreacted metal that is not silicided may be removed by a selective wet etching process to remove metal without attacking the silicide. In DRAM and eDRAM devices, silicides may be found in the drain region, bitline contact, wordline and interconnecting pathways.

As noted in the '399 patent, in the art, silicidizing (siliciding) silicon-containing regions has achieved success in reducing resistance and improving functionality at low operating temperatures, however, notwithstanding the success, it has become evident that DRAM yields are affected by: a) excessive node junction leakage due to the presence of the silicide; and b) silicide agglomeration on the wordline and in the active area. As a result, current DRAM and eDRAM manufacturing processes have steered completely away from silicidizing the pathways and structures. Consequently, the only silicide seen is these structures is a polycided wordline i.e., gate conductor (GC), comprising tungsten silicide on a highly doped polysilicon.

As noted in the '399 patent, since silicides offer the potential for low resistance and reliable operation at low temperature, it is desirable to continue to utilize silicides in memory structures, but without the aforementioned problems.

Figure 1:
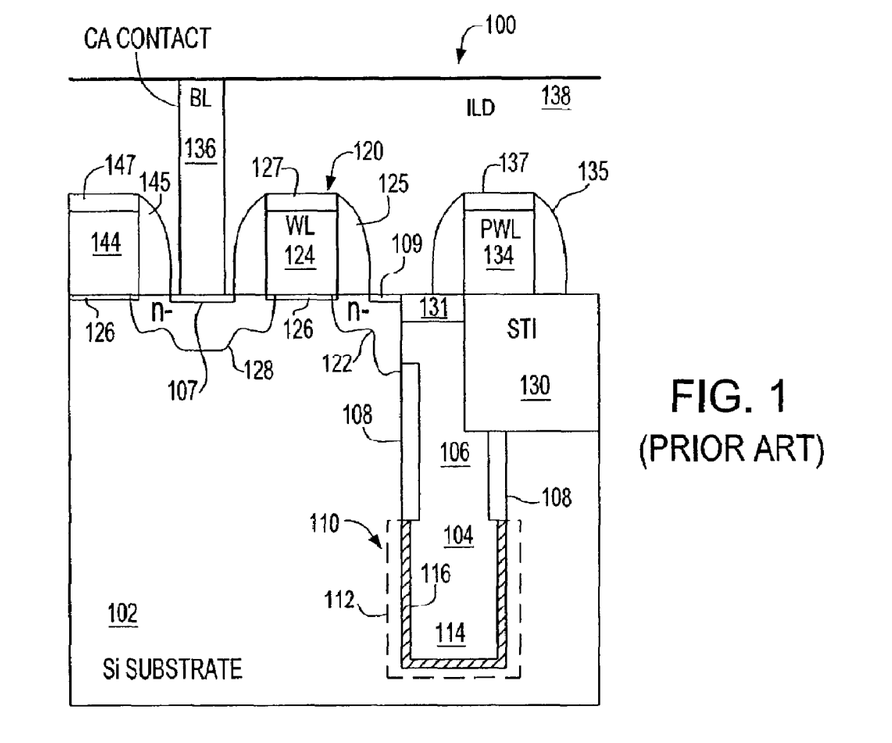
FIG. 1 is a cross-sectional diagram of a DRAM cell of the prior art.

FIG. 1 illustrates, generally, a DRAM (or eDRAM) cell 100 based on the teachings of the '399 patent. The description is very general, and is intended to give the reader a sense of what is going on technically, as well as a sense of scale. Dimensions are merely exemplary. The processes required to form the various structures are all very well known to those having ordinary skill in the art to which the present invention most nearly pertains, and therefore need not be discussed in any great detail.

An exemplary one of a plurality of DRAM cells 100 is disposed adjacent an exemplary one of a plurality of logic devices (not shown) in a silicon (Si) substrate (wafer) 102. The silicon wafer 102 may be lightly doped. For each DRAM cell, a deep trench (DT) 104 is formed in the wafer 102, extending from the top surface of the wafer into the substrate 102. Preferably, the trench 104 has an aspect ratio (depth:width) of greater than 40:1. A typical trench for a DRAM cell would have depth (vertical on the page) of approximately greater than 60,000 Angstroms (6000 nm, 6 µm), a width (across the page) of approximately greater than 1000 Angstroms (>100 nm, >0.1 µm), and a length (into the page) of approximately greater than 1500 Angstroms (>150 nm, >0.15 µm), and an overall elliptical cylinder type.

A cell capacitor 110 is formed at a bottom portion of the deep trench 104 and comprises (electrically speaking) a first plate 112, a second plate 114, and a dielectric (node dielectric) 116 separating the two plates. The first plate 112, sometimes referred to as the "buried plate", is simply a heavily doped region in the substrate 102 adjacent a bottom portion of the trench 104. The second plate 114 (sometimes referred to as "node plate") is a conductive structure which is formed in the bottom of the trench, such as n+ (arsenic doped) polysilicon. The node dielectric 116 is suitably nitride or oxynitride formed in the bottom portion of the trench. The height of the cell capacitor 110 is typically approximately greater than 4.5 μm (micrometer), and it typically has a capacitance of approximately 20-40 fF (femtoFarads).

A storage node conductor (or simply, "node") 106 extends from near the top of the trench 104 to the node plate 114 of the cell capacitor 110, and is surrounded by a collar 108 of oxide. (Or, looking at it in the other direction, the node conductor extends from the cell capacitor, through the collar, towards the top of the trench.) The collar 108 is disposed above the cell capacitor 110 in the deep trench 104. The storage node conductor 106 comprises n+ polysilicon, has a length of >1 μm, and has a thickness of >40 nm. The collar 108 comprises oxide, has a length of approximately 0.7 μm, and has a thickness of >30 nm. Generally speaking, the storage node conductor 106 connects the cell capacitor 110 to a cell transistor (120), as described in greater detail hereinbelow.

A cell transistor 120 is associated with and connected to the cell capacitor 110. A buried strap (not specifically shown, usually arsenic (As) dopant in the node conductor 106) is disposed atop the collar 108 and out-diffuses (to the left in the figure) to become a doped (n−) node 122 (i.e., the source, or drain, of the cell transistor 120, depending on polarity, hereinafter "source diffusion") of the cell transistor 120. A polysilicon (poly) conductor (PC) 124 is disposed atop a thin gate oxide 126 on the surface of the substrate 102, adjacent but spaced from the trench 104. The PC 124 functions as the gate conductor (GC) of the cell transistor 120, and also functions as the "word line" (WL) of the DRAM cell. The source diffusion region 122 extends from the trench 104, namely from the node conductor 106, to just under the PC 124. Another diffusion area (n−) 128 is formed on the other side of the PC 124, and will serve as the drain (or source, of the cell transistor 120, depending on polarity) of the cell transistor 120.

Figure 1A:
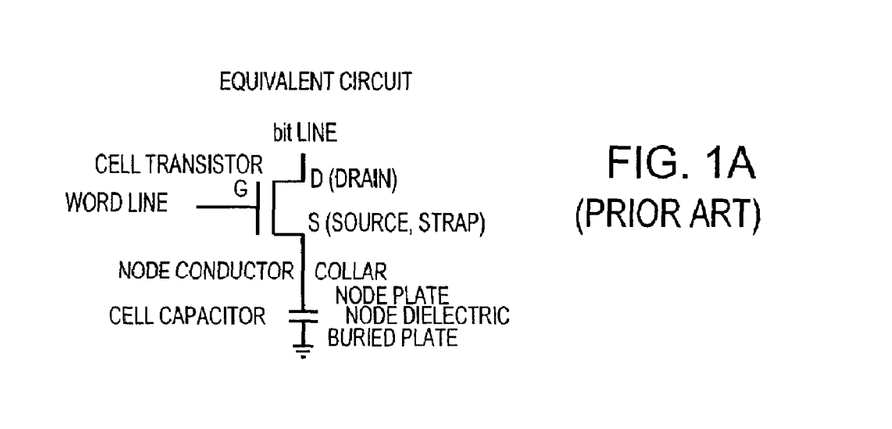
FIG. 1A is a schematic diagram of an equivalent circuit for a DRAM cell, according to the prior art.

FIG. 1A illustrates an equivalent circuit for the DRAM cell described hereinabove. A cell transistor is represented having a source (S) connected via the node conductor (106) to the node plate (114), a drain (D) typically connected to a bit line (not shown), and a gate (G) connected to a word line (not shown). Generally, the source (S) can be swapped for the drain (D), depending on the chosen polarity of the overall circuit.

Returning to FIG. 1, oxide comprising trench top oxide (TTO) 131 and shallow trench isolation (STI) 130 is disposed in a top portion of the trench 104, generally atop the collar 108, and level with the top surface of the substrate 102. The TTO 131 is an oxide structure on top of the DT node 106, for isolating electrically DT node 106 and passing word line (PWL) 134. The STI 130 is an oxide structure, for isolating electrically between adjacent DRAM cells. (For example, a second DRAM cell (not shown) which is a mirror image of the illustrated DRAM cell, disposed adjacent, immediately to the right of the DRAM cell which is shown. The STI would extend into both DTs, separating and isolating the two DTs from one another.) Generally, the TTO 131 is formed first by depositing oxide on top of DT node 106, and then followed by STI litho (lithography) and RIE (reactive ion etching). Oxide is deposited to fill the etched region and it forms the STI 130, followed by STI CMP (Chemical Mechanical Polish). STI RIE will etch the deep trench (DT) 104, collar oxide 108 and Si substrate 102 simultaneously. The general purpose of the STI structure 130 is to isolate both DRAM cells and logic devices. Therefore the STI process is typically executed at both DRAM array and logic device region simultaneously.

A second PC line 134 (compare 124) is formed atop the TTO 131 and the STI oxide 130, generally above the trench 104, and functions as a "passing word line" (PWL).

A third PC line 144 (compare 124) is shown, formed atop thin gate oxide 126 on the surface of the substrate 102, on a far end of the drain diffusion 128, and would function as a word line for another DRAM cell adjacent (again "mirror" image, this time to the left of) the illustrated DRAM cell.

The three PC lines 124 (as shown cell), 134 (back or front cell of STI 130) and 144 (left hand side DRAM cell of CA contact 136) all function as gate electrodes (or gate conductors (GCs)) at different cells. The GC 144 is essentially a "mirror image" of the GC 124—the CA contact 136 acting as a kind of "pivot point".

Sidewall spacers 125, 135 and 145 are formed in a conventional manner on both sides of the respective gate electrodes 124, 134 and 144, as illustrated. The gate electrodes 124, 134 and 144 are typically similarly sized (substantially the same size as one another), having a width (left-to-right, as viewed) such as approximately 90 nm (which is according to "design rule", in this example the design rule is 90 nm). The sidewall spacers 125, 135 and 145 typically all have the same thickness ("t", which is the thickness of the sidewall spacer deposition), such as approximately 30-50 nm. The sidewall spacers 125, 135 and 145 suitably comprise nitride. In this example, the thickness of each of the sidewall spacers is approximately 30-40 nm.

The gate electrodes 124, 134 and 144 are shown as being evenly spaced from one another. (Evenly spaced gate electrodes have benefit in litho and RIE.) There is a space (X) between adjacent gate electrodes, such as approximately 90-100 nm. This space (X) between adjacent gate electrodes is greater than twice (2×) the thickness (t) of a given sidewall spacer (X>2t). The importance of these dimensions and their relationship to one another will become more apparent from the description of FIG. 2 that follows.

After sidewall spacer formation, the structure is silicided. This results in silicide being formed everywhere that silicon (or polysilicon) is exposed. (Silicide does not form on materials such as nitride or oxide.) More particularly, silicide 127, 137 and 147 is formed on the exposed top surfaces of the respective gate electrodes 124, 134 and 144, as illustrated. This is common procedure, and the silicide is very beneficial as a contact material. The silicide 127, 137, 147 atop poly 124, 134, 144 typically has a thickness of 30-40 nm.

During silicidization (silicidation), silicide is also formed on exposed areas of the substrate 102, whether doped or not. In one instance, silicide 107 is formed on the drain region 128 in the exposed area between the sidewall spacers 145 and 125. A CA (Contact Array) contact 136 extends through interlevel dielectric (ILD) 138 to make contact with the drain 128, via the silicide 107. This is common procedure, and the silicide 107 is very beneficial as a contact material. The silicide 107 atop silicon has a thickness of approximately 30 nm. (The CA contact 136 will function as the aforementioned "bit line" (BL) contact.)

It should be noted that there is a gap between the sidewall spacers 125 (on the right hand side of gate electrode 124) and 135 (on the left hand side of gate electrode 134). Part of this gap comprises exposed substrate surface in the source (S) diffusion area 122, and part of the gap comprises exposed TTO (oxide) 131. During silicidization (silicidation), silicide 109 will form on the exposed surface of the diffusion area 122. This is common procedure, but the silicide is not beneficial in this area because (i) it is not serving any useful purpose as a contact material, and (ii) it creates a severe electric potential gradient that adversely affects retention time.

It will of course be understood that DRAM cells need power supply, voltage amplifier, ring oscillator, etc. All these devices are logic devices and are located in a support region near the DRAM cells. These devices are omitted, for illustrative clarity. Although included in the drawing, the elements to the left of the CA contact are really not necessary for understanding the context or principles of the invention (described hereinbelow).

For purposes of this discussion, the main problem being illustrated by FIG. 1 is that silicide 109 is formed within what is called the "memory cell area" of the DRAM cell—more particularly, right in the source region 122 of the DRAM cell itself, rather than only on the PC lines or on the drain contact (128) which is considered to be outside of the memory cell area since it is on the other (far) side of the gate (word line) 124.

Figure 2:
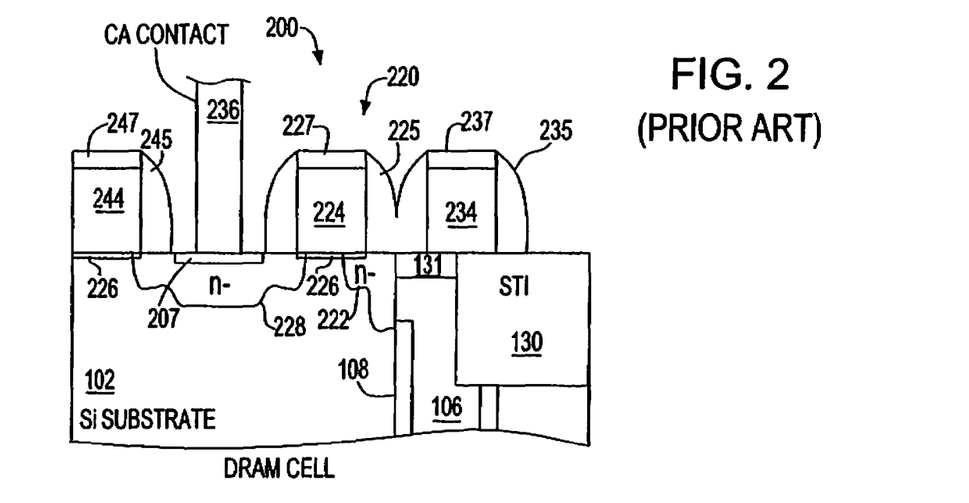
FIG. 2 is a cross-sectional diagram of a DRAM cell of the prior art.

FIG. 2 illustrates a prior art solution to the problem of silicide forming in the memory cell area of the DRAM cell 200. This solution is proposed by "New Embedded DRAM Technology using Self-aligned Salicide (Self-Aligned Silicide) Block (SSB) Process for 0.18 um SOC (System on a Chip)", Kokubun et al, ULSI Device Engineering Laboratory, Semiconductor Group, Toshiba Corporation. As noted in the article, The embedded DRAM (eDRAM) is one of the key device to meet the demand for a system on a single chip. The best way to realize high performance eDRAM is to introduce Logic technology directly, such as dual work function gate and salicide technology. However, it was reported that applying salicide technology directly to trench capacitor DRAM memory cell area degraded DRAM retention characteristics because of junction leak of silicided storage node contact in array.

The DRAM cell of FIG. 2 is very similar to that of FIG. 1, and therefore identical elements will be labeled identically. Similar elements will generally be labeled similarly (e.g., gate electrode 224 is similar but not identical to gate electrode 124.) The difference, generally, is that what is being done in FIG. 2 versus FIG. 1 is that the word line (WL) 224 (compare 124, FIG. 1) is moved closer to the passing word line (PWL) 234 (compare 134, FIG. 1) so that there is no gap between the respective adjacent sidewall spacers (225 and 235)—hence, there is no exposed silicon in the source diffusion area 222 (compare 122) that can become silicided (109), therefore performance is not degraded. Also, due to the similarities between FIG. 2 and FIG. 1, lower structures such as the cell capacitor (110) are not shown, for illustrative clarity, the figure terminating in the middle of the collar 108. Also, the upper portion of the CA contact 236 (compare 136) and the ILD (compare 138) are not explicitly shown, again for illustrative clarity.

Generally, in this example, the GC (word line) 224 is moved further from the CA 236, to get closer to the GC (passing word line) 234 and, in this example, the sidewall spacers "merge" and there is no gap between them as there was in the example of FIG. 1.

Since the word line 224 is further from the CA contact 236, the "mirror image" word line of the adjacent (to the left) cell is also a bit further from the CA contact 236. This is illustrative of the fact that it is convenient to use the CA contact as a "pivot point" (reference point) in the design.

More particularly, the DRAM cell comprises a deep trench 104. A collar 108 is disposed in the trench atop the cell capacitor (110, not shown). Trench Top Oxide (TTO) 131 and shallow trench oxide (STI) 130 is formed at an upper portion of the trench, and has a top surface substantially even with the top surface of the substrate 102.

A cell transistor 220 (compare 120) is associated with and connected to the cell capacitor (110). A buried strap is disposed atop the collar 108 and out-diffuses (to the left in the figure) to the source (S) region 222 (compare 122) of the cell transistor 220. A PC line 224 (compare 124) is disposed atop a thin gate oxide 226 (compare 126) on the surface of the substrate 102, adjacent but spaced from the trench 104. The PC line 224 functions as the gate (G) of the cell transistor, and also functions as the "word line" of the DRAM cell. The source (S) diffusion 222 extends from the trench 104, namely from the node conductor 106, to just under the PC line 224. Another diffusion area (n−) 228 (compare 128) is formed on the other side of the PC line 224, and will serve as the drain (or source, of the cell transistor 220, depending on polarity) of the cell transistor 220. The equivalent circuit of the memory cell of FIG. 2 is essentially the same as the equivalent circuit of the memory cell of FIG. 1. (See FIG. 1A.)

The source diffusion 222 looks a little different than the source diffusion 122, and this is because it is slightly narrower, due to the narrower spacing between GCs 224 and 234.

A second PC line (gate electrode) 234 (compare 124) is formed atop the TTO 131 and the STI oxide 130 generally atop the trench 104, and functions as a "passing word line" (PWL).

A third PC line (gate electrode) 244 (compare 124) is formed atop thin gate oxide 126 on the surface of the substrate 102, on a far end of the drain diffusion 128, and functions as a word line for an adjacent DRAM cell, as described above.

Sidewall spacers 225, 235 and 245 (compare 125, 135 and 145) are formed on sides of the respective gate electrodes 224, 234 and 244, as illustrated. The sidewall spacers have a width (thickness "t") of approximately 30-40 nm, as was the case in FIG. 1.

The gate electrodes 224, 234, 244 are typically similarly sized (substantially the same size as one another), having a width (left-to-right, as viewed) of approximately the size of design rule, as was the case in FIG. 1. However, whereas in FIG. 1 the gate electrodes 124, 134 and 144 were shown as being evenly spaced from one another (X~ the size of design rule), in this case the PC lines 224, 234, 244 are not evenly spaced from one another. Notably, the gate electrodes 224 (word line) and 234 (passing word line) are much closer to one another in FIG. 2 than they were in FIG. 1. For example, there is a space of approximately 40-70 nm (90 nm of design rule), between adjacent the gate electrodes 244 and 224, and there is a space of approximately 110-140 nm (90 nm of design rule), between the adjacent gate electrodes 224 and 234. This latter dimension is the important thing that is being illustrated here. Generally, the scale of the two figures (FIGS. 1 and 2) are the same as one another, although no representation is made here that they are truly to scale.

Because the sidewall spacers have a thickness (t) greater than half the distance between the word line 224 and the passing word line 234, the material (e.g., nitride) of the sidewall spacer will fill the gap between the PC lines 224 and 234, and therefore there is no exposed silicon in the source diffusion area 222 (compare 122) that can become silicided (109), hence memory cell performance is not degraded.

After sidewall spacer formation, the structure is silicided, as described above. This results in silicide structures 227, 237 and 247 (compare 127, 137 and 147) is formed on the exposed top surfaces of the respective PC lines 224, 234 and 244.

Silicide is also formed on exposed areas of the substrate, such as in the exposed area 207 between the sidewall spacers 245 and 225. A CA contact 236 (compare 136) extends through interlevel dielectric (ILD, 110, not explicitly shown) to make contact with the drain 228, via the silicide 207.

Because there is no gap between the sidewall spacers 225 and 235, during silicidization (silicidation), silicide will not form on the diffusion area 222. Therefore, a severe electric potential gradient (as discussed above, with respect to FIG. 1) will not be created that adversely affects retention time. However, the problem with the FIG. 2 solution is with GC litho and RIE. Un-even spacing of the gate electrodes (GCs) makes it difficult to pattern the GC line and it caused difficulty in shrinking the devices. GC RIE also has problem in etching the GC line. At the very narrow region, RIE tends to be very difficult.

From the above it becomes apparent that there is an ongoing need to lower wordline resistance and bitline contact resistance, improve retention time while advantageously employing array silicide, and to improve the margin of gate conductor (GC) lithography.

SUMMARY OF THE INVENTION

According to the invention, a DRAM cell comprises: a deep trench extending into a surface of a substrate; a cell capacitor formed at a bottom portion of the deep trench; a collar disposed in the deep trench above the cell capacitor; a node conductor disposed in the trench extending from the cell capacitor, through the collar towards the surface of the substrate; oxide formed at an upper portion of the trench, atop the node conductor; a first gate electrode disposed atop the oxide; a second gate electrode disposed on the surface of the substrate on a one side of the deep trench; sidewall spacers disposed on sides of the first and second gate electrodes; a gap between the sidewall spacers of the first and second gate electrodes wherein the surface of the substrate is exposed in the gap; and a diffusion region extending from a top portion of the deep trench to the second gate electrode; wherein: the oxide extends beyond the trench towards the second gate electrode, within the surface of the substrate, spanning the gap between the spacer of the first gate electrode and spacer of the second gate electrode.

According to the invention, a method of forming a DRAM cell in a silicon (Si) substrate, the DRAM cell comprising a deep trench and a gate electrode formed on a surface of the Si substrate adjacent the deep trench, the comprises the steps of: forming pad oxide on the surface of a Si substrate; forming pad nitride on the surface of the pad oxide; creating a deep trench extending into the substrate; forming a cell capacitor at a bottom portion of the deep trench; forming a collar within the deep trench; filling the deep trench with poly to form a node plate and a node conductor; filling the trench above the collar with doped poly to provide dopant source of buried strap and act as a node conductor; recessing the doped poly under the surface of the substrate; and performing nitride pull back of nitride at both top and side of trench; wherein the undercut extends laterally into the substrate on each side of the trench at least to under a sidewall spacer on the gate electrode. An STI gap is formed. The STI gap and the undercut are filled with oxide, which is planarized. The pad nitride and pad oxide are removed. Gate electrodes are formed, with spacers. Source/drain implantation is performed. Silicidization is performed.

According to the invention, a DRAM cell in a substrate comprises: a deep trench extending from a surface of the substrate into the substrate; a word line formed on the surface of the substrate adjacent the deep trench; and oxide disposed in a top portion of the trench and extending beyond the trench in the direction of the word line.

Advantages of the present invention include:
1. Lower wordline resistance and bitline contact resistance without retention time degradation.
2. Can be easily implemented without additional mask step.
3. Lithography-friendly process (no need for excessively small gate conductor space).
4. S/D implant can be used for reducing buried strap resistance.

BRIEF DESCRIPTIONS OF THE DRAWINGS

The structure, operation, and advantages of the present invention will become further apparent upon consideration of the following description taken in conjunction with the accompanying figures (FIGS.). The figures are intended to be illustrative, not limiting.

Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity.

In the drawings accompanying the description that follows, often both reference numerals and legends (labels, text descriptions) may be used to identify elements. If legends are provided, they are intended merely as an aid to the reader, and should not in any way be interpreted as limiting.

Often, similar elements may be referred to by similar numbers in various figures (FIGs) of the drawing, in which case typically the last two significant digits may be the same, the most significant digit being the number of the drawing figure (FIG).

DETAILED DESCRIPTION OF THE INVENTION

In the description that follows, numerous details are set forth in order to provide a thorough understanding of the present invention. It will be appreciated by those skilled in the art that variations of these specific details are possible while still achieving the results of the present invention. However, well-known processing steps may not be described in detail in order to avoid unnecessarily obfuscating the description of the present invention.

Materials (e.g., silicon dioxide) may be referred to by their formal and/or common names, as well as by their chemical formula. Regarding chemical formulas, numbers may be presented in normal font rather than as subscripts. For example, silicon dioxide may be referred to simply as "oxide", chemical formula $SiO_2$. For example, silicon nitride (stoichiometrically $Si_3N_4$, often abbreviated as "SiN") may be referred to simply as "nitride".

In the description that follows, exemplary dimensions may be presented for an illustrative embodiment of the invention.

The dimensions should not be interpreted as limiting. They may be included to provide a sense of proportion. Generally speaking, it is the relationship between various elements, where they are located, their contrasting compositions, and sometimes their relative sizes that is of significance.

Figure 3:
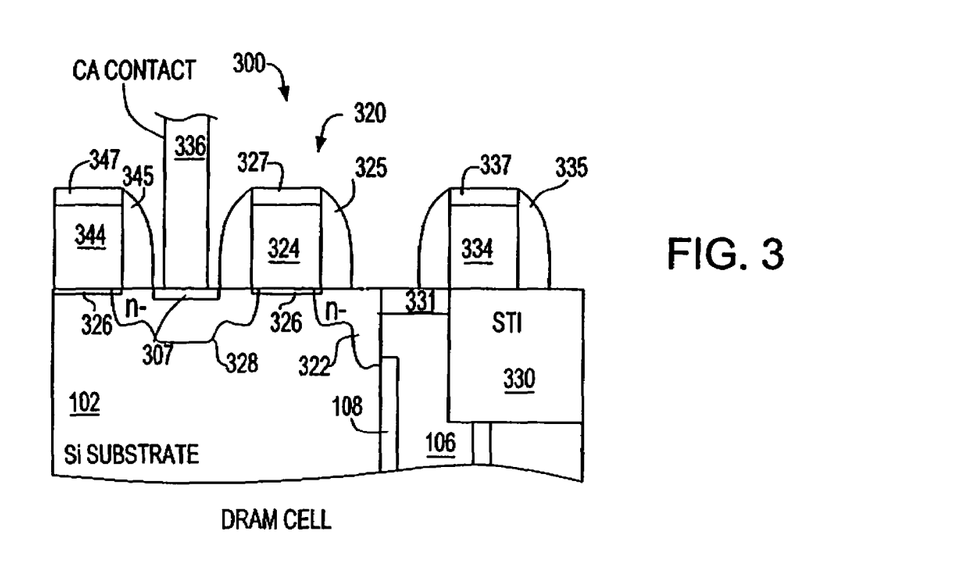
FIG. 3 is a cross-sectional diagram of a DRAM cell, according to an embodiment of the invention.

FIG. 3 illustrates an embodiment of invention. The DRAM cell 300 of FIG. 3 is very similar to the DRAM cell 100 of FIG. 1, and therefore identical elements will be labeled identically. The principal difference is that generally, what is being done in FIG. 3 versus FIG. 1 is that the TTO 331 (compare 131) extends from within the trench 104 towards (in the direction of) the word line (WL) 324 (compare 124), into the diffusion area 322 (compare 122). Thus, although there is a gap between the respective adjacent sidewall spacers (325 and 335), and an area of the substrate 102 that "could" be silicided, because of the TTO 331 extending across the gap, the exposed area of the substrate 102 is oxide rather than silicon, hence there is no exposed silicon in the source diffusion area (322) that can become silicided (109), and therefore memory performance is not degraded. Due to the similarities between FIG. 3 and FIG. 1, lower structures such as the cell capacitor (110) are not shown, for illustrative clarity, the figure terminating in the middle of the collar 108. Also, the upper portion of the CA contact 336 (compare 136) and the ILD (compare 138) are not explicitly shown, again for illustrative clarity.

Significantly, in the embodiment of FIG. 3, the PC lines (gate electrodes) 324, 334 and 344 (compare 124, 134 and 144) are similarly sized and evenly spaced, as in FIG. 1. The same dimensions and spacing may apply, along with all the benefits attributable to these dimensions and spacing. As mentioned above, evenly spaced gate electrodes have benefit in litho and RIE.

More particularly, the DRAM cell comprises a deep trench 104. A collar 108 is disposed in the trench atop the cell capacitor (110, not shown). Shallow trench isolation (STI) 330 (compare 130) is formed at an upper portion of the trench, and has a top surface substantially even with the top surface of the substrate 102.

A cell transistor 320 (compare 120) is associated with and connected to the cell capacitor (110). A buried strap is disposed atop the collar 108 and out-diffuses (to the left in the figure) to become the source (S) region 322 (compare 122) of the cell transistor 320. A PC line 324 (compare 124) is disposed atop a thin gate oxide 326 (compare 126) on the surface of the substrate 102, adjacent but spaced from the trench 104. The PC line 324 functions as the gate (G) of the cell transistor, and also functions as the "word line" of the DRAM cell. The source (S) diffusion 322 extends from the trench 104, namely from the node conductor 106, to just under the gate electrode 324. The source (S) diffusion 322 of FIG. 3 is noticeably different than the source diffusion 122 of FIG. 1, basically in that the TTO structure 331 intrudes on the source diffusion 322 and ultimately there is no silicide (compare 109) formed at the top of the source diffusion 322.

Another diffusion area (n−) 328 (compare 128) is formed on the other side of the gate electrode 324, and will serve as the drain (or source, of the cell transistor 320, depending on polarity) of the cell transistor 320. The equivalent circuit of the memory cell of FIG. 3 is essentially the same as the equivalent circuit of the memory cell of FIG. 1. (See FIG. 1A.)

A shallow trench isolation (STI) structure 330 is shown disposed in a top portion of the trench 104, generally atop the collar 108, and level with the surface of the substrate 102. This is an oxide structure. The purpose of the STI structure 330 is generally the same as the previously described STI structures 130 and 230.

Here is one area where the embodiment of FIG. 3 differs substantially from either of the previous examples of FIGS. 1 and 2. Whereas the TTO structures 131 in FIG. 1 and FIG. 2 were entirely within the trench 104 on the gate electrode (word line) 124, 224 side of the trench 104, in this embodiment of the invention the TTO structure 331 extends beyond the trench 104 in the direction of the word line (WL) 324, within the surface of the substrate, resulting in oxide rather than silicon at the surface of the substrate and, significantly, spanning the gap between the sidewall spacers (described below) of the two gate electrodes 324 and 334. The oxide (TTO) should not touch gate oxide. Thus, there should be no TTO oxide under the gate electrode (gate conductor (GC)). The TTO oxide should be only under spacer and on the Si substrate. The STI process is generally the same for all three examples (FIGS. 1, 2, 3), and it is the TTO that is different.

Generally, the TTO 331 extends from the deep trench to the word line 324 adjacent the deep trench. More particularly, the TTO 331 extends to under the sidewall spacer on the passing word line side (i.e., trench side) of the word line. More particularly, the TTO 331 bridges a gap between the sidewall spacer on the word line side of the passing word line and the sidewall spacer on the passing word line side of the word line. (It is not necessary for the TTO to extend to under the word line, just to under the sidewall spacer on the word line.) Or, the TTO 331 bridges a gap between the deep trench and the sidewall spacer on the passing word line side of the word line. (It is not necessary for the TTO to extend from the word line-side spacer on the passing word line, just from the trench.) In any case, the TTO extends outside of the trench, towards the adjacent word line and, in conjunction with the sidewall spacers, prevents any silicon from being exposed and silicided.

A second gate electrode 334 (compare 124) is formed atop the TTO 331 and STI oxide 330 (mostly atop STI 330) generally atop the trench 104, and functions as a "passing word line" (PWL). A third gate electrode 344 (compare 124) is formed atop thin gate oxide 326 on the surface of the substrate 102, on a far end of the drain diffusion 328, for an adjacent DRAM cell.

Sidewall spacers 325, 335 and 345 (compare 125, 135 and 145) are formed on sides of the respective gate electrodes 324, 334 and 344, as illustrated. The gate electrodes 324, 334 and 344 and the sidewall spacers 325, 335 and 345 can have the same composition, size and spacing as their counterparts in the example of the DRAM cell 100 of FIG. 1. Thus, the gate electrodes 324, 334 and 344 are shown as being similarly sized and evenly spaced.

As in FIG. 1, because the sidewall spacers have a thickness (t) which is less than half the distance (X) between the word line (gate electrode) 324 and the passing word line (gate electrode) 334, the material (e.g., nitride) of the sidewall spacer will not fill the gap between the gate electrodes 324 and 334. However, whereas in FIG. 1 there was exposed silicon in the source diffusion area 122 that could (and does) become silicided (109), in the embodiment of FIG. 3 there is oxide (TTO 331) in this area rather than silicon, and therefore the gap between the gate electrodes 324 and 334 will not become silicided, and therefore performance (e.g., retention time) will not be degraded.

After spacer formation, the structure is silicided, as described above. This results in silicide structures 327, 337 and 347 (compare 127, 137 and 147) formed on the exposed top surfaces of the respective gate electrodes 324, 334 and 344.

Silicide is also formed on exposed areas of the substrate, such as in the exposed area 307 between the sidewall spacers 345 and 325. A CA contact 336 (compare 136) extends through interlevel dielectric (ILD, 110) to make contact with the drain 328, via the silicide 307.

Because there is no silicidization occurring between the sidewall spacers 325 and 335, a severe electric potential gradient will not be created that adversely affects retention time.

An Exemplary Process Flow

FIGS. 4A, 4B, 4C and 4D illustrate a sequence of steps for forming the DRAM cell (e.g., 300) of the present invention. The process is relevant to a method of forming a DRAM cell in a Si substrate, the DRAM cell comprising a deep trench and a gate electrode (324, word line) formed on a surface of the Si substrate adjacent the deep trench.

Beginning with a substrate 402 (compare 102), conventional process steps such as those which could be used to make the DRAM cells 100 of FIG. 1 or 200 of FIG. 2, may be performed to:

form pad oxide on the surface of the substrate 402;
form pad nitride on the surface of the pad oxide;
create a deep trench 404 (compare 104) extending into the substrate 402;
form the cell capacitor (110) at a bottom portion of the deep trench;
form the collar 408 (compare 108) within the deep trench;
fill the deep trench 404 with poly to form the node plate 414 (compare 114) and the storage node conductor 406 (compare 106);
recess the storage node conductor 406 and collar 408 to open the buried strap region (buried strap region is the area where highly doped by dopant out-diffusion of As-doped LPCVD poly 411);
fill the trench 404 above the collar with As-doped LPCVD poly 411 to connect the node plate to buried strap; and
recess the doped poly 411.

Figure 4A:
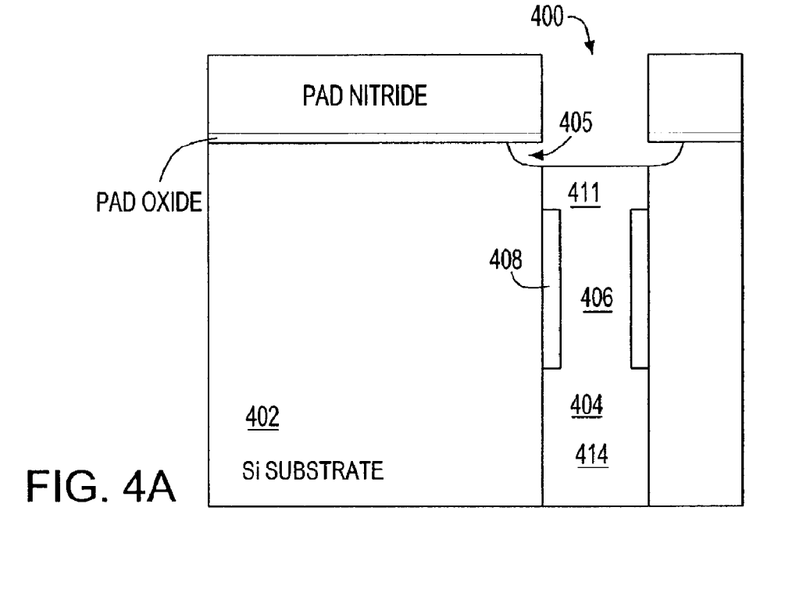
FIGS. 4A, 4B, 4C and 4D are cross-sectional view diagrams illustrating a sequence of steps for forming a memory cell, according to the invention.

Next, as shown in FIG. 4A, starting with an inchoate memory cell having a collar and doped poly in the trench (as described above)—namely, having a cell capacitor, including collar and node conductor—perform isotropic poly and Si substrate etch, such as using hot SC-1 or any isotropic silicon RIE (reactive ion etch). (Performing nitride pull back of nitride at both top and side of trench.) This results in a void (or recess, or undercut) 405 being formed under the pad nitride (and pad oxide). (This also results in the top surface of the poly 406 being more recessed below the surface of the substrate 102.) The penetration of this undercut 405 laterally into the substrate is approximately up to 1000 Å on each of both lateral (left and right, as viewed) sides of the trench 404. To give this a sense of scale, the trench 404 has a lateral width of approximately 500-1000 Å. The void on the right of the trench will be filled with oxide just like on the left of the trench. But during the STI process, it will be etch and filled with STI oxide again.

Figure 4B:
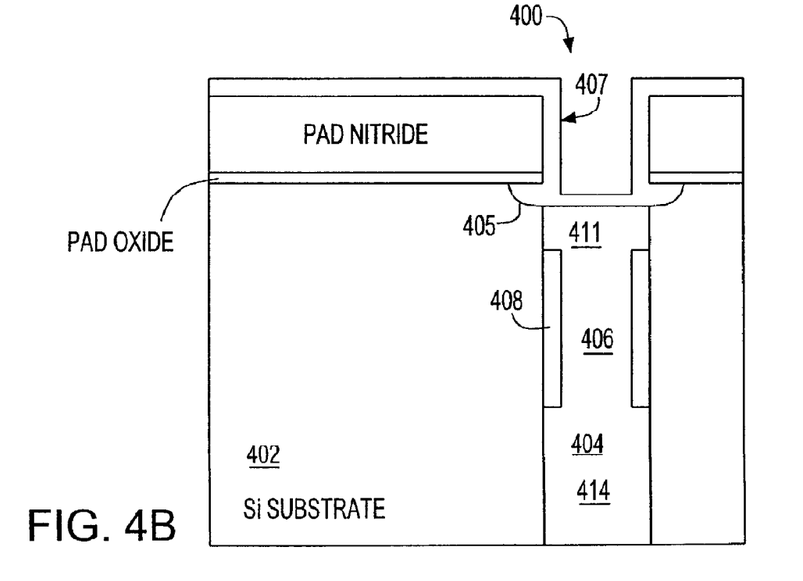

Next, as shown in FIG. 4B, the undercut 405 is filled with oxide 407, such as 500-1000 Å of oxide deposited using a process such as conformal LPCVD (low pressure chemical vapor deposition).

Alternatively, at FIG. 4A,

Pull back the nitride (uniform etch of nitride at both top and side of trench).

Etch both poly silicon 411 and Si substrate 402 simultaneously.

Deposit oxide and STI process (skip FIG. 4B).

Figure 4C:
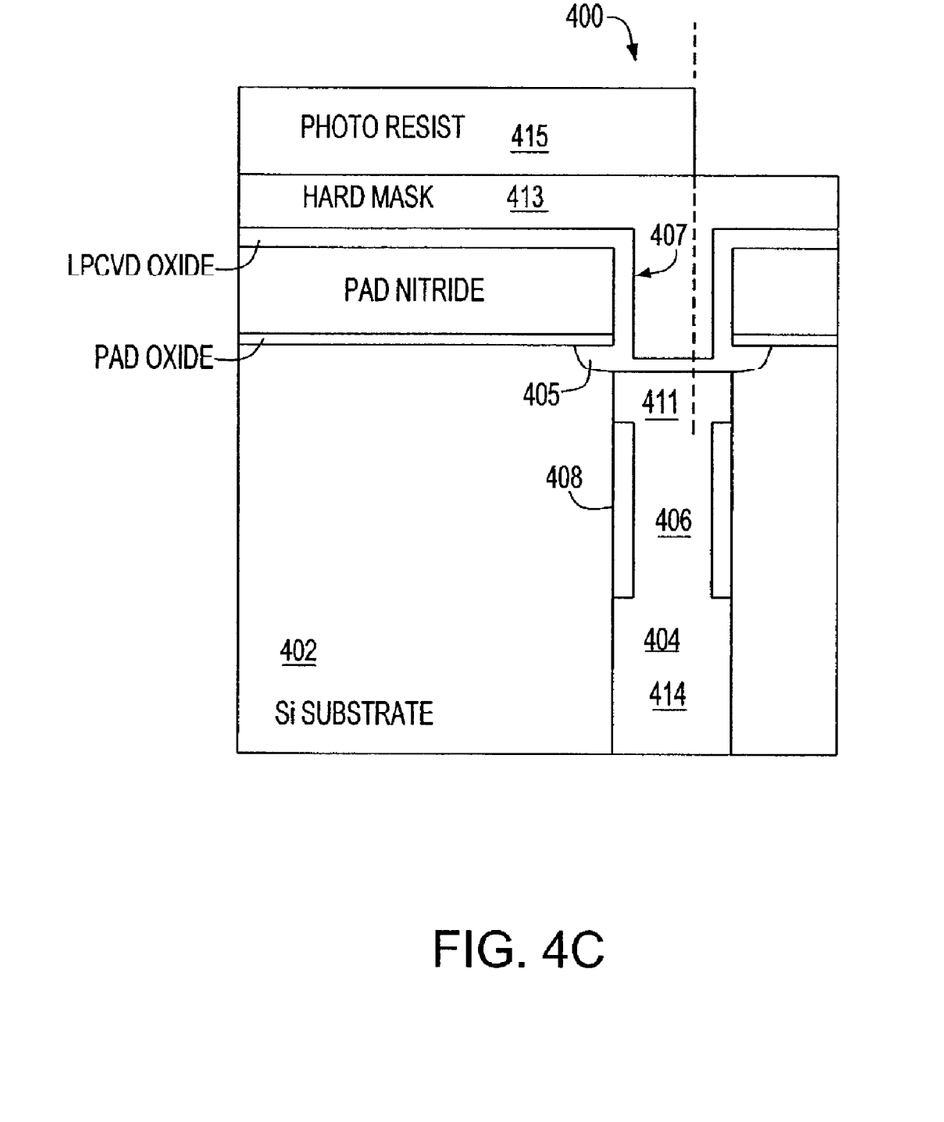

Next, as shown in FIG. 4C, a hard mask 413 is deposited, such as 2800 Å of BSG (borosilicate glass) deposited by PECVD (plasma enhanced CVD).

Figure 4D:
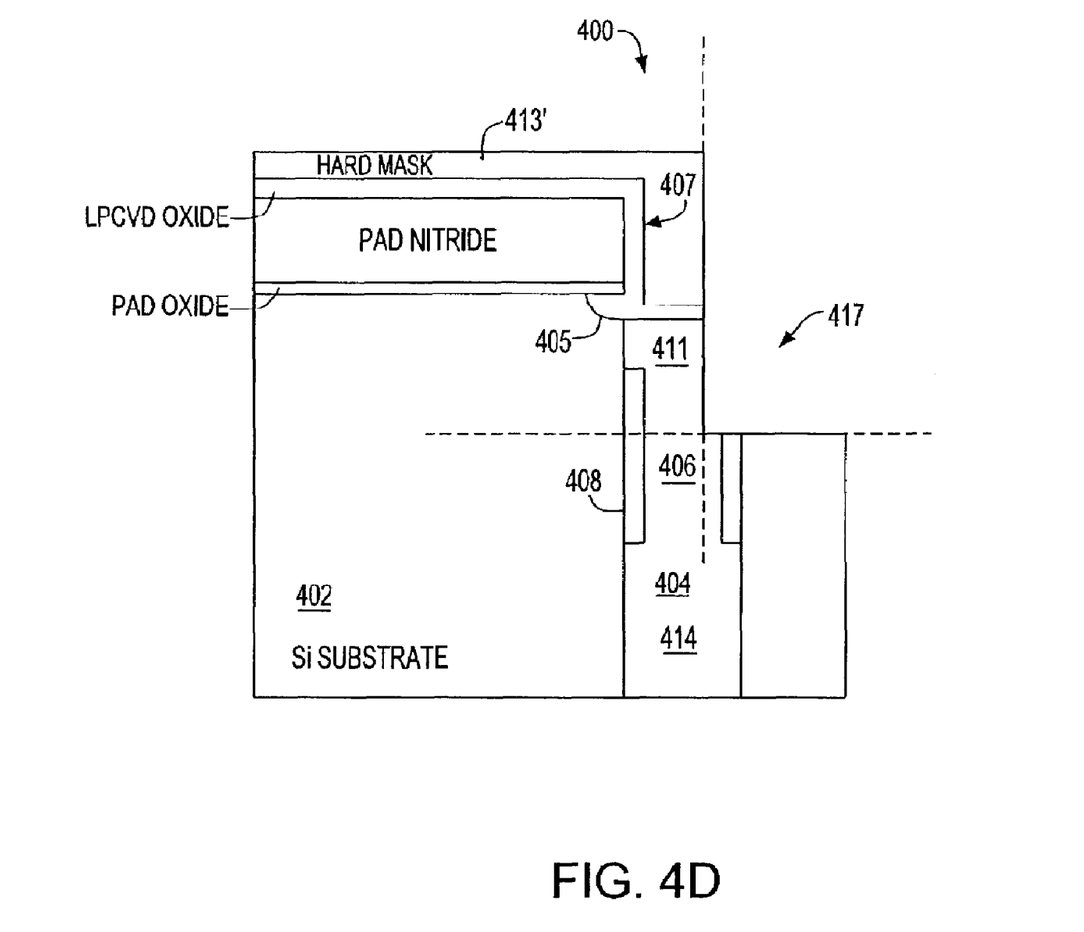

Next, the BSG hard mask 413 is opened using RIE (reactive ion etching), the photoresist (415) is stripped, and the Si substrate 102 is etched using RIE, resulting in an STI gap 417. The resulting structure is shown in FIG. 4D.

Next, using conventional processes such as those which could be used to make the DRAM cells 100 of FIG. 1 or 200 of FIG. 2, the STI gap 417 is filled with HDP (high density plasma) oxide and planarized. And the pad nitride is removed. (The pad oxide is also removed to grow gate oxide.)

Next, using conventional processes such as those which could be used to make the DRAM cells 100 of FIG. 1 or 200 of FIG. 2, the gate electrodes (324, 334, 344) are formed, including gate oxide (226) formation.

Next, using conventional processes such as those which could be used to make the DRAM cells 100 of FIG. 1 or 200 of FIG. 2, spacer oxide (a first portion of the overall spacers 325, 335, 345) is deposited and etched. Then the drain 328 is implanted. Generally, the process scheme is the conventional LDD (Lightly Doped Drain) process. The first step is a light dose of implantation after spacer oxide and the next step is a higher dose of implantation after spacer nitride. Sometimes, the first step of the implantation is called array extension implantation.

Next, using conventional processes such as those which could be used to make the DRAM cells 100 of FIG. 1 or 200 of FIG. 2, spacer nitride (a second portion of the overall spacers 325, 335, 345) is deposited and etched. This completes spacer formation.

Next, using conventional processes such as those which could be used to make the DRAM cells 100 of FIG. 1 or 200 of FIG. 2, source/drain implantation is performed (high dose, low energy implantation).

Next, using conventional processes such as those which could be used to make the DRAM cells 100 of FIG. 1 or 200 of FIG. 2, silicidation is performed (metal deposition, annealing, etc.).

Next, using conventional processes such as those which could be used to make the DRAM cells 100 of FIG. 1 or 200 of FIG. 2, ILD (138) is deposited and chemical-mechanical polished (CMP), and the CA contact (336) is formed (litho, RIE, contact fill) and the final product is chemical-mechanical polished (CMP), resulting in the memory cell 300 of FIG. 3 (except that ILD is not explicitly shown in FIG. 3).

Although the invention has been shown and described with respect to a certain preferred embodiment or embodiments, certain equivalent alterations and modifications will occur to others skilled in the art upon the reading and understanding of this specification and the annexed drawings. In particular regard to the various functions performed by the above described components (assemblies, devices, circuits, etc.) the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

What is claimed is:

1. A DRAM cell in a substrate, comprising:
a deep trench extending from a surface of the substrate into the substrate;
a word line formed on the surface of the substrate adjacent the deep trench;
an oxide layer disposed in a top portion of the trench and extending beyond the trench in the direction of the word line;
a passing word line disposed above the deep trench;
a first sidewall spacer formed on a trench-facing side of the word line;
a second sidewall spacer formed on a word line-facing side of the passing word line; and
a gap between the first sidewall spacer and the second sidewall spacer;
wherein the word line constitutes a gate of a cell transistor for the DRAM cell;
a diffusion area of the cell transistor extends from the gate to the deep trench; and
the oxide layer extends across the gap and on the diffusion area of the cell transistor so that no silicide will be formed on top of the diffusion area; and
further comprising silicide structures formed on exposed surfaces of the word line and the passing word line, as well as on exposed areas of the substrate wherein the exposed areas of the substrate comprise silicon.

2. The DRAM cell of claim 1, wherein:
the oxide layer comprises trench top oxide (TTO).

3. The DRAM cell of claim 2, wherein:
the trench top oxide has a top surface which is substantially even with a top surface of the substrate.

4. The DRAM cell of claim 2, wherein:
the word line and the passing word line are spaced a distance (X) of approximately 90 nm spaced apart from one another; and the first and second spacers each has a thickness of approximately 30-44 nm.

5. The DRAM cell of claim 1, wherein:
the first and second sidewall spacers each has a thickness (t) which is less than half of a distance (X) between the word line and the passing word line.

* * * * *